United States Patent
Wang et al.

(10) Patent No.: US 9,378,806 B2
(45) Date of Patent: Jun. 28, 2016

(54) BOOSTING VOLTAGE LEVEL

(71) Applicant: TAIWAN SEMICONDUCTOR MANUFACTURING COMPANY, LTD., Hsinchu (TW)

(72) Inventors: Bing Wang, Palo Alto, CA (US); Kuoyuan (Peter) Hsu, San Jose, CA (US); Annie-Li-Keow Lum, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 62 days.

(21) Appl. No.: 14/107,017

(22) Filed: Dec. 16, 2013

(65) Prior Publication Data
US 2015/0170737 A1    Jun. 18, 2015

(51) Int. Cl.
G11C 11/00  (2006.01)
G11C 11/419 (2006.01)
G11C 7/12   (2006.01)

(52) U.S. Cl.
CPC ............... *G11C 11/419* (2013.01); *G11C 7/12* (2013.01)

(58) Field of Classification Search
USPC ........................................................ 365/156
See application file for complete search history.

(56) References Cited

U.S. PATENT DOCUMENTS

| | | | | |
|---|---|---|---|---|
| 5,801,569 A | * | 9/1998 | Pinkham ............. | G11C 7/1051 327/333 |
| 2001/0043493 A1 | * | 11/2001 | Fujioka ................ | G06F 1/3203 365/189.09 |
| 2005/0237848 A1 | * | 10/2005 | Takahashi ............. | G11C 5/145 365/232 |
| 2006/0232326 A1 | * | 10/2006 | Seitz ........................ | G05F 3/30 327/539 |

* cited by examiner

*Primary Examiner* — Hoai V Ho
*Assistant Examiner* — Pablo Huerta
(74) *Attorney, Agent, or Firm* — Hauptman Ham, LLP

(57) ABSTRACT

A circuit comprises a driver, a first capacitive device, and a second capacitive device. The driver has an input node, an output node, and a driver supply voltage node. The first capacitive device has a first terminal and a second terminal. The second capacitive device has a first terminal and a second terminal. The first terminal of the first capacitive device is configured to receive a first signal. The second terminal of the first capacitive device is coupled with the driver supply voltage node. The output of the driver is coupled with a first end of the second capacitive device.

20 Claims, 3 Drawing Sheets

BOOSTING VOLTAGE LEVEL

FIELD

The present disclosure is related to boosting a voltage level.

BACKGROUND

For illustration, a static random access memory (SRAM) includes a pair of write bit lines WBL and WBLB. Further, a low and a high logical value are applied to corresponding write bit lines WBL and WBLB to be written to the memory cell. In various situations, a negative write bit line technique is used in which a voltage value lower than a value of supply voltage VSS is applied to bit line WBL, for example. In some approaches, a relatively large capacitor is used to generate the negative voltage for write bit line WBL, resulting in a large layout for the memory array having the memory cell.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
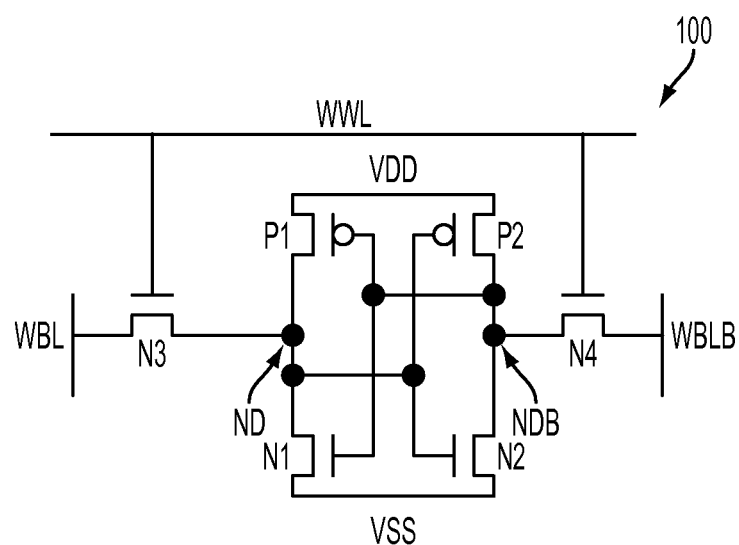
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a negative voltage is generated for a write bit line, with two metal oxide semiconductor (MOS) capacitors. Even if two capacitors are used, total circuit layout is reduced compared with circuit layout in another approach that uses one capacitor.

Memory Cell

FIG. 1 is a circuit diagram of a memory cell 100, in accordance with some embodiments. In some embodiments, a plurality of memory cells 100 is arranged in rows and columns of a memory array.

Memory cell 100 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or cross-coupled inverters. Transistors P1 and N1 form a first inverter while transistors P2 and N2 form a second inverter. Drains of transistors P1 and N1 are coupled together and form a node ND. Drains of transistors P2 and N2 are coupled together and form a node NDB. Gates of transistors P1 and N1 are coupled together and to drains of transistors P2 and N2. Gates of transistors P2 and N2 are coupled together and to drains of transistors P1 and N1.

A write word line WWL is coupled with a gate of each of transistors N3 and N4 of a plurality of memory cells 100 in a row of memory cells. Write word line WWL is also called a write control line because the signal on write word line WWL controls transistors N3 and N4 for data on write bit lines WBL and WBLB to be written to corresponding nodes ND and NDB.

Each of transistor N3 and transistor N4 is called a pass gate transistor. Drains of transistors N3 and N4 are coupled to the pair of write bit lines WBL and WBLB, respectively. Write bit lines WBL and WBLB are coupled to each drain of transistors N3 and N4 of a plurality of memory cells 100 in a column of a memory array. Each of write bit lines WBL and WBLB is also called a write data line because the data carried on write bit lines WBL and WBLB is written to corresponding nodes ND and NDB.

In a write operation of memory cell 100, data to be written to memory cell 100 is applied to write bit lines WBL and WBLB. Write word line WWL is then activated to turn on transistors N3 and N4. As a result, the data on bit lines WBL and WBLB is transferred to and is stored in corresponding nodes ND and NDB.

For illustration, a low and a high logical value are written to nodes ND and NDB, respectively. As a result, a corresponding low and a high logical value are applied to write bit lines WBL and WBLB to be transferred to corresponding nodes ND and NDB. In some embodiments, both write bit lines WBL and WBLB are pre-charged to a high logical value. Pre-charge refers to charging to a high logical value before writing. Write bit line WBL is then pulled to ground or a reference supply voltage VSS to have a low logical value. In various embodiments, write bit line WBL is pulled to a voltage lower than voltage VSS so that, at the time the data on write bit line WBL is transferred to node ND, write bit line WBL has a negative voltage. Causing a voltage on write bit line WBL to change from 0 V to a negative voltage is called negative boosting.

Negative Voltage Boosting

Figure 2:
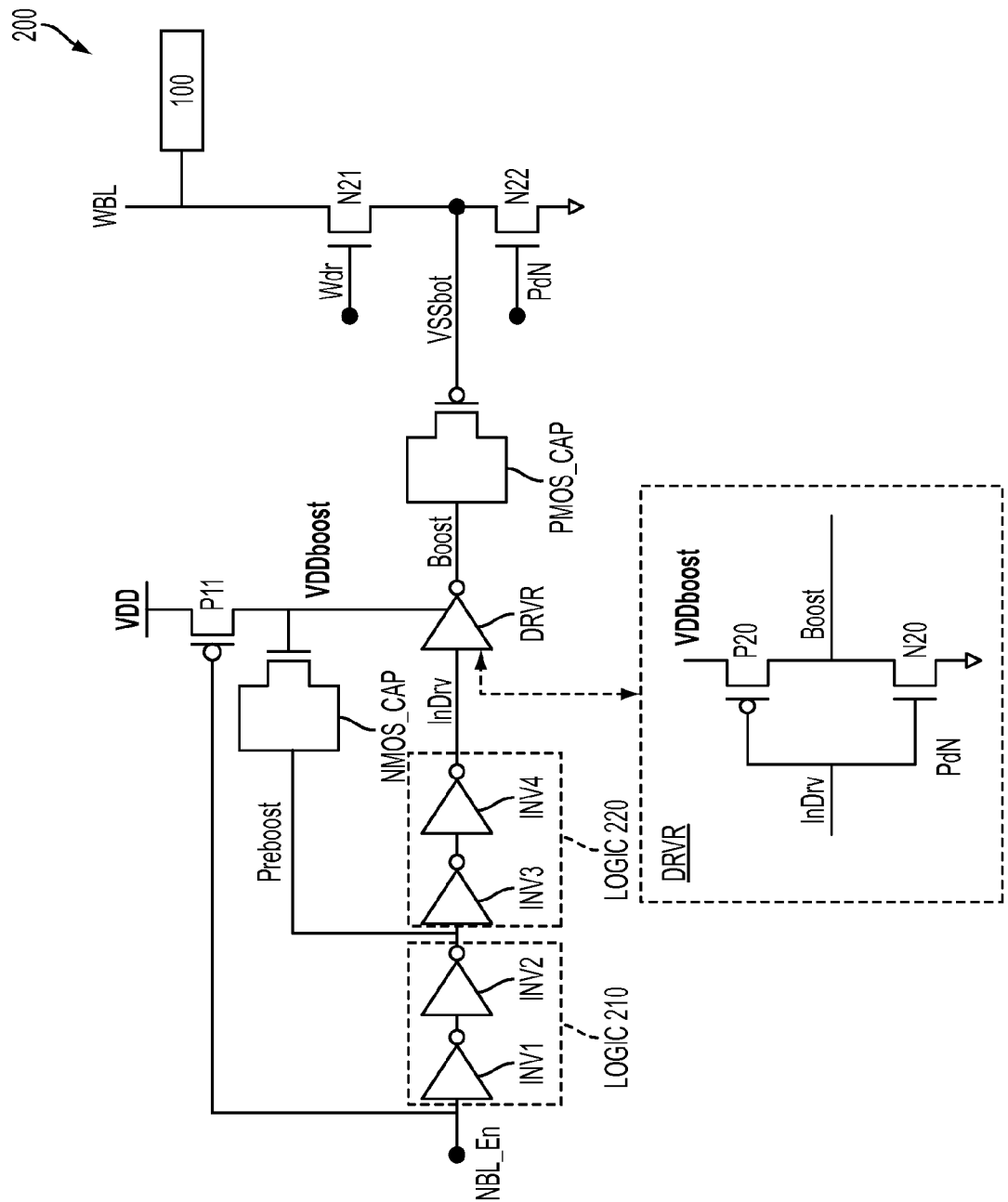
FIG. 2 is a diagram of a circuit having a voltage boost circuitry for use with the memory cell in FIG. 1, in accordance with some embodiments.

FIG. 2 is a diagram of a circuit 200, in accordance with some embodiments. For illustration, circuit 200 includes circuitry to negatively boost a voltage on write bit line WBL of memory cell 100 in FIG. 1. Negatively boosting mechanism illustrated in FIG. 2 is applicable to write bit line WBLB and other electrical lines.

NMOS transistor N21 functions to electrically connect and disconnect write bit line WBL to and from signal VSSbot. Transistor N21 is turned on and off by signal Wdr at a gate of transistor N21.

NMOS transistor N22 functions to selectively set signal VSSbot at a low logical value to be negatively boosted, which will be explained in detail below. Transistor N22 is turned on and off by signal Pdn at a gate of transistor N22.

Driver DRVR receives signal InDry at an input node and provides a signal Boost at an output node. In some embodiments, as illustratively shown in FIG. 2, driver DRVR is an inverter comprising PMOS transistor P20 coupled in series with NMOS transistor N20. A source of PMOS transistor P20 receives signal VDDboost, serves as a supply voltage node for driver DRVR, and is called a driver supply voltage node. Because driver DRVR functions as an inverter, signal InDry and signal Boost are a logical inverse of one another.

A first terminal of capacitor NMOS_Cap receives signal Preboost. A second terminal of capacitor NMOS_Cap is coupled with a drain of PMOS transistor P11 and has signal VDDboost. Capacitor NMOS_Cap is used to boost or raise signal VDDboost. For illustration, transistor P11 is turned on, signal VDDboost is pulled to supply voltage VDD at a source of transistor P11. Transistor P11 is then turned off. Signal VDDboost is therefore electrically disconnected from supply voltage VDD. Signal Preboost is then caused to transition from a low to a high logical value at supply voltage VDD. By operation of a capacitor, capacitor NMOS_Cap causes signal VDDboost to be raised by voltage ΔVD shown in FIG. 3. In some embodiments, a value of voltage ΔVD is determined, and a size of capacitor NMOS_Cap is determined accordingly to provide a corresponding capacitance to result in voltage ΔVD. In some embodiments, voltage ΔVD is about 20% of a voltage difference between supply voltage VDD and a reference supply voltage VSS, and is determined to provide voltage ΔWBL shown in FIG. 3.

A first terminal of capacitor PMOS_Cap receives signal Boost. A second terminal of capacitor PMOS_Cap is coupled with a source of transistor N21 and has signal VSSbot. Capacitor PMOS_Cap is used to negatively boost or lower signal VSSbot. For illustration, transistor N22 is turned on, signal VSSbot is pulled to reference supply voltage VSS at the source of transistor N22, which, in some embodiments, is ground as shown in FIG. 2. Transistor N22 is then turned off, and signal VSSbot is therefore electrically disconnected from reference supply voltage VSS. Signal Boost is then caused to transition from a high to a low logical value of reference supply voltage VSS. By operation of a capacitor, capacitor PMOS_Cap causes signal VSSbot to be lowered by voltage ΔWBL shown in FIG. 3. In some embodiments, a value of voltage ΔWBL is determined, and a size of capacitor PMOS_Cap is determined accordingly to provide a corresponding capacitance to result in voltage ΔWBL.

Capacitors NMOS_Cap and PMOS_Cap are used for illustration. Other types of capacitors, capacitive devices, networks, etc., are within the contemplated scope of the present disclosure.

Logic circuit (Logic) 210 operates as a buffer and provides a time delay to turn off transistor P11 at a time for signal VDDboost to be boosted. For example, signal NBL_En is applied with a low logical value for transistor P11 to turn on and pull signal VDDboost to supply voltage VDD. When signal NBL_En is logically high to turn off transistor P11, signal NBL_En also causes signal Preboost to be logically high to boost signal VDDboost. Inverters INV1 and INV2 are designed to provide a delay time to ensure that transistor P11 is completely off before signal Preboost causes capacitor NMOS_Cap to boost signal VDDboost.

Logic circuit (Logic) 220 operates as a buffer and provides a time delay for capacitor PMOS_Cap to boost signal VSSbot at a predetermined time. For example signal NBL_En is applied with a logical value for transistor P11 to turn on and pull signal VDDboost to supply voltage VDD. Signal InDry at the input of driver DRVR is also logically low by operation of inverters INV1, INV2, INV3, and INV4. As a result, transistor N20 is off and transistor P20 is on and pulls signal Boost to supply voltage VDD at the source of transistor P20. When signal NBL_En is logically high to turn off transistor P11, signal NBL_En also causes signal Boost to be logically low so that capacitor PMOS_Cap can negatively boost signal VSSbot. Inverters INV3 and INV4 are designed to provide a delay time such that voltage VDDboost reaches a predetermined value such as when VDDboost reaches VDDraised, before falling down as explained in FIG. 3.

Various mechanisms to provide a delay time to signal Preboost and to signal Boost are within the contemplated scope of the present disclosure.

Waveforms

Figure 3:
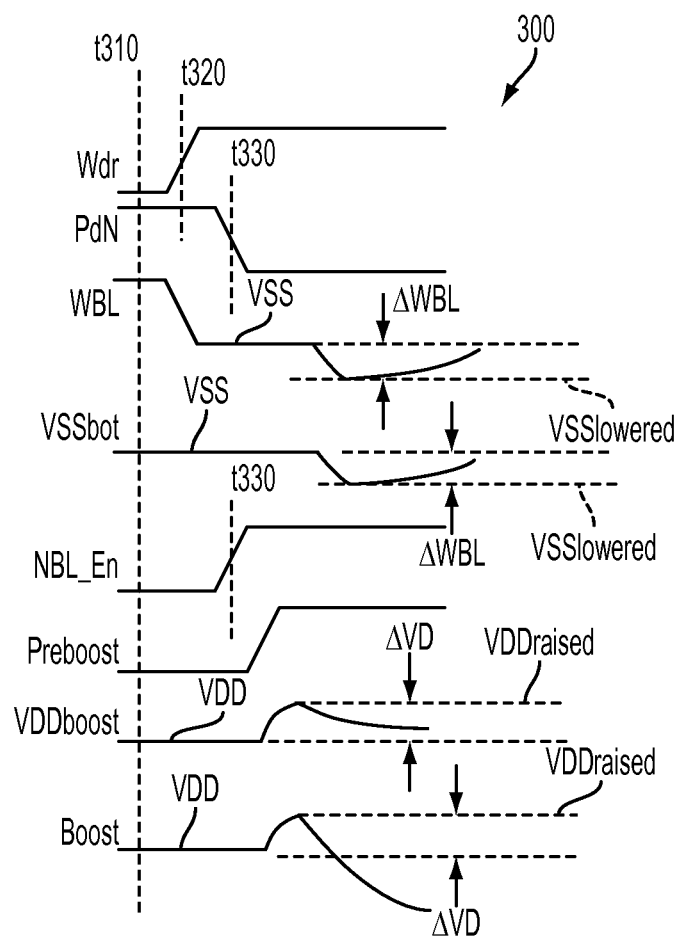
FIG. 3 is a graph of waveforms of various signals of the circuit in FIG. 2, in accordance with some embodiments.

FIG. 3 is a graph of waveforms 300 illustrating operations of circuit 200, in accordance with some embodiments.

At time t310, signal Wdr is applied with a low logical value. As a result, transistor N21 is turned off and electrically disconnects write bit line WBL from signal VSSbot.

In the meantime, signal PdN is applied with a high logical value. As a result, transistor N22 is turned on and pulls signal VSSbot to reference supply voltage VSS at the source of transistor N22, which, in some embodiments, is ground.

Write bit line WBL is pre-charged to a high logical value.

Signal NBL_En is applied with a low logical value. Because signal NBL_En is at the gate of transistor P11, transistor P11 is turned on, which pulls signal VDDboost to supply voltage VDD at the source of transistor P11. By operations of inverters INV1 and INV2, signal Preboost is logically low. By operations of inverters INV1, INV2, INV3, INV4, and driver DRVR, signal Boost is logically high at the value of supply voltage VDD.

At time t320, signal Wdr is applied with a high logical value. As a result, transistor N21 is turned on to electrically connect write bit line WBL to signal VSSbot. Because both transistors N21 and N22 are turned on, write bit line WBL is pulled to a low logical value at the source of transistor N22.

At time t330 when write bit line WBL is logically low of reference supply voltage VSS, signal PdN is applied with a low logical value to turn off transistor N22. As a result, signal VSSbot is electrically disconnected from voltage VSS.

At about time t330, signal NBL_En is applied with a high logical value. As a result, transistor P11 is turned off, and signal VDDboost is electrically disconnected from supply voltage VDD.

Because signal NBL_En is logically high, signal Preboost, after the delay of inverters INV1 and INV2, is also logically high by operation of inverters INV1 and INV2.

Because signal Preboost is logically high at supply voltage VDD and signal VDDboost is at supply voltage VDD, by operation of capacitor NMOS_Cap, signal VDDboost is raised voltage ΔVD to voltage VDDraised. Because signal VDDboost is raised by voltage ΔVD to voltage VDDraised, signal Boost is also raised by voltage ΔVD to voltage VDDraised.

Because signal Preboost is logically high, by operation of inverters INV3 and INV4, signal InDry is logically high after a time delay of inverters INV1, INV2, INV3, and INV4. Because signal InDry is logically high, by operation of driver DRVR, signal Boost is pulled towards voltage VSS at the source of transistor N22.

Because signal VSSbot is at voltage VSS, by operation of capacitor PMOS_Cap, the transition of signal Boost from VDDraised to VSS causes signal VSSbot to be lowered by a voltage ΔWBL to reach voltage VSSlowered.

In some embodiments, the voltage dropped across the drain and the source of transistor N21 is insignificant with respect to voltage ΔWBL. As a result, the signal on write bit line WBL is the same as signal VSSbot. In other words, write bit line WBL is also lowered by voltage ΔWBL to reach voltage VSSlowered. In some embodiments, when write bit line WBL is at a predetermined voltage below VSS, the data on write bit line WBL is transferred to node ND. Effectively, write bit line WBL has a voltage value low enough for a successful write to node ND.

Various embodiments of the present disclosure are advantageous over other approaches. For example, in the above illustration, signal Boost transitions from voltage VDDraised towards voltage VSS and causes write bit line WBL to be lowered by voltage ΔWBL. In contrast, in other approaches, signal Boost transitions from voltage VDD, instead of voltage VDDraised, towards voltage VSS and causes write bit line WBL to be lowered by voltage ΔWBL', for example. The absolute value of voltage ΔWBL' is smaller than the absolute value of voltage ΔWBL because the transition of signal VDDboost from voltage VDD to voltage VSS in other approaches is smaller the transition of signal VDDboost from voltage VDDraised to voltage VSS in various embodiments of the present disclosure. Effectively, write bit line WBL in various embodiments of the present disclosure is set to have a more negative voltage level than that of write bit line WBL of other approaches when the data on write bit line WBL is transferred into node ND. As a result, node ND is written with a low logical value easier than in other approaches.

Boosted Voltege Level

For illustration, C.PMOS_Cap is the capacitance of capacitor PMOS_Cap, C.VSSbot is the capacitance seen by signal VSSbot at a terminal of capacitor PMOS_Cap, and C.WBL is the capacitance seen by write bit line WBL. In some embodiments, voltage ΔWBL is chosen such that write bit line WBL has a sufficient low voltage for a successful write to node ND. Having WBL negatively boosted takes time. As a result, consideration is almost made so that the total time to write to node ND is within a predetermined time value.

In some embodiments, voltage ΔVD is a selected value based on various considerations. The higher voltage ΔVD, the larger the absolute value |ΔWBL| of voltage ΔWBL. However, when voltage ΔVD reaches a predetermined value, functionality of transistor P1 is unreliable. As a result, voltage ΔVD is selected such transistor P1 continues to function reliably in various manufacturing process, temperature and voltage conditions. In some embodiments, voltage ΔVD is selected to be about 20% of a difference between VDD and VSS. Having a value of voltage ΔVD, a size of capacitance C.NMOS_Cap is determined.

Mathematically, $$\Delta WBL = C.PMOS\_Cap*(VDD+\Delta VD)/(C.WBL+C.VSSbot) \quad (10)$$ or $$C.PMOS\_Cap = \Delta WBL*(C.WBL+C.VSSbot)/(VDD+\Delta VD) \quad (20)$$

In some embodiments, supply voltage VDD, capacitance C.WBL and capacitance C.VSSbot are each known. Given a selected value of voltage ΔVD, capacitance C.PMOS_Cap is determined based on equation (20). Further, based on equation (20), as voltage ΔVD increases, capacitance C.PMOS_Cap decreases when voltage ΔWBL, capacitance C.WBL, capacitance C.VSSbot and supply voltage VDD stay at the same values. Effectively, when signal VDDboost increases to voltage VDDraised, capacitance C.PMOS_Cap is reduced, compared with the situation when signal VDDboost is not raised. In some embodiments, because capacitance C.PMOS_Cap is reduced, even two MOS capacitors PMOS_Cap and NMOS_Cap are used in FIG. 2, the total circuit layout of various embodiments of the present disclosure is reduced, compared with the situation when signal VDDboost is not raised.

Based on equation (10), when ΔVD=20% (VDD−VSS), VSS=0 V, and if C.PMOS_Cap/(C.WBL+C.VSSbot)=⅕, for example, then $$\Delta WBL = \frac{1}{5}*(VDD+\Delta VD)$$

$$\Delta WBL = \frac{1}{5}*1.2 VDD = 0.24 VDD$$

In some embodiments, a circuit comprises a driver, a first capacitive device, and a second capacitive device. The driver has an input node, an output node, and a driver supply voltage node. The first capacitive device has a first terminal and a second terminal. The second capacitive device has a first terminal and a second terminal. The first terminal of the first capacitive device is configured to receive a first signal. The second terminal of the first capacitive device is coupled with the driver supply voltage node. The output of the driver is coupled with a first end of the second capacitive device.

In some embodiments, a circuit comprises a first logic circuit, a second logic circuit, a driver, a first capacitive device, and a second capacitive device. The first logic circuit has a first input and a first output. The second logic circuit has a second input and a second output. The driver has a driver input, a driver output, and a driver supply node. The first output is coupled with the second input and with a first terminal of the first capacitive device. The second output is coupled with driver input. The driver supply node is coupled with a second terminal of first capacitive device. The driver output is coupled with a first terminal of the second capacitive device.

In some embodiments, a voltage of an output of a driver is caused to be at a first voltage value. The output of the driver is coupled with a first end of a first capacitive device. A voltage of a supply voltage node of the driver is caused to be at a supply voltage value. The supply voltage node is coupled with a first end of a second capacitive device and is configured to provide a supply voltage to the driver. Based on the second capacitive device, the supply voltage value of the supply voltage node is changed.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor functions as a drain, and a drain functions as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a supply voltage node;
a driver having an input node, an output node, and a driver supply voltage node switchably coupled with the supply voltage node;
a first capacitive device having a first terminal and a second terminal; and
a second capacitive device having a first terminal and a second terminal,
wherein
the first terminal of the first capacitive device is configured to receive a first signal;
the second terminal of the first capacitive device is coupled with the driver supply voltage node; and
the output of the driver is coupled with the first terminal of the second capacitive device.

2. The circuit of claim 1, wherein the circuit is configured to meet at least one of the following conditions:
the first capacitive device is an NMOS capacitor; or
the second capacitive device is a PMOS capacitor.

3. The circuit of claim 1, wherein
the driver includes a P-type transistor coupled in series with an N-type transistor to form an inverter; and
a terminal of the P-type transistor is configured as the driver supply voltage node.

4. The circuit of claim 1, comprising
a first N-type transistor;
a second N-type transistor; and
a first terminal of the first N-type transistor is coupled with a first terminal of the second N-type transistor and with the second terminal of the second capacitive device.

5. The circuit of claim 4, comprising
a memory cell; and
a data line,
wherein
the data line is coupled with the memory cell and a second terminal of the first N-type transistor.

6. The circuit of claim 5, wherein
a second terminal of the second N-type transistor is configured to receive a reference supply voltage.

7. The circuit of claim 1, comprising
a first logic circuit; and
a second logic circuit,
wherein
the first logic circuit and the second logic circuit are each configured as a buffer;
an output of the first logic circuit is coupled with an input of the second logic circuit and with the first terminal of the first capacitive device; and
an output of the second logic circuit is coupled with the input of the driver.

8. The circuit of claim 7, comprising
a P-type transistor having a first terminal, a second terminal, and a third terminal,
wherein
the first terminal of the P-type transistor is coupled with an input of the first logic circuit;
a second terminal of the P-type transistor is coupled with the second terminal of the first capacitive device; and
a third terminal of the P-type transistor is configured to receive a supply voltage from the supply voltage node.

9. The circuit of claim 7, wherein the circuit is configured to meet at least one of the following conditions:
the first logic circuit includes a first inverter coupled in series with a second inverter; or
the second logic circuit includes a third inverter coupled in series with a fourth inverter.

10. A circuit comprising:
a supply voltage node;
a first logic circuit having a first input and a first output;
a second logic circuit having a second input and a second output;
a driver having a driver input, a driver output, and a driver supply node switchably coupled with the supply voltage node;
a first capacitive device; and
a second capacitive device,
wherein
the first output is coupled with the second input and with a first terminal of the first capacitive device;
the second output is coupled with the driver input;
the driver supply node is coupled with a second terminal of the first capacitive device; and
the driver output is coupled with a first terminal of the second capacitive device.

11. The circuit of claim 10, wherein
the driver comprises a P-type transistor and an N-type transistor;
a gate of the P-type transistor is coupled with a gate of the N-type transistor, and is configured as the driver input;
a drain of the P-type transistor is coupled with a drain of the N-type transistor, and is configured as the driver output; and
a source of the P-type transistor is configured as the driver supply voltage node.

12. The circuit of claim 10, comprising
a P-type transistor;
a gate of the P-type transistor is coupled with the first input;
a drain of the P-type transistor is coupled with the second terminal of the first capacitive device; and
a source of the P-type transistor is configured to receive a supply voltage from the supply voltage node.

13. The circuit of claim 10, comprising
a first N-type transistor;
a second N-type transistor; and
a source of the first N-type transistor is coupled with a drain of the second N-type transistor and with the second terminal of the second capacitive device.

14. The circuit of claim 13, comprising
a memory cell; and
a data line,
wherein
the data line is coupled with the memory cell and a drain of the first N-type transistor; and
a source of the second N-type transistor is configured to receive a reference supply voltage.

15. The circuit of claim 10, wherein
the circuit is configured to meet at least one of the following conditions:
the first capacitive device includes an NMOS capacitor; or
the second capacitive device includes a PMOS capacitor.

16. The circuit of claim 10, wherein the circuit is configured to meet at least one of the following conditions:
the first logic circuit includes a first inverter coupled with a second inverter;
the second logic circuit includes a third inverter coupled with a fourth inverter;
an output of the first logic circuit is coupled with an input of the second logic circuit and with the first terminal of the first capacitive device; and an output of the second logic circuit is coupled with the driver input.

17. A method comprising:

causing a voltage of an output of a driver to be at a first voltage value, wherein the output of the driver is coupled with a first end of a first capacitive device;

causing a voltage of a supply voltage node of the driver to be at a supply voltage value, wherein the supply voltage node is coupled with a first end of a second capacitive device and is configured to provide a supply voltage to the driver; and based on the second capacitive device, changing the supply voltage value of the supply voltage node.

18. The method of claim 17, comprising:

based on the first capacitive device, changing a voltage value of a second end of the first capacitive device.

19. The method of claim 17, wherein the driver includes a P-type transistor coupled in series with an N-type transistor to form an inverter; and a terminal of the P-type transistor is configured as the supply voltage node.

20. The method of claim 17, comprising:

providing a signal at an input of the driver by buffering a signal at a second end of the second capacitive device.

\* \* \* \* \*